(12) United States Patent
Lim

(10) Patent No.: US 9,825,146 B2
(45) Date of Patent: Nov. 21, 2017

(54) DUMMY BIT LINE MOS CAPACITOR AND DEVICE USING THE SAME

(71) Applicant: SK hynix Inc., Icheon (KR)

(72) Inventor: Jeong Sub Lim, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/961,815

(22) Filed: Dec. 7, 2015

(65) Prior Publication Data

US 2016/0087072 A1   Mar. 24, 2016

Related U.S. Application Data

(62) Division of application No. 13/692,910, filed on Dec. 3, 2012, now Pat. No. 9,236,501.

(30) Foreign Application Priority Data

Jul. 17, 2012   (KR) .................. 10-2012-0077878

(51) Int. Cl.
*H01L 29/66* (2006.01)
*H01L 29/94* (2006.01)
(Continued)

(52) U.S. Cl.
CPC .......... *H01L 29/66181* (2013.01); *G11C 7/18* (2013.01); *H01L 21/02532* (2013.01); *H01L 21/02595* (2013.01); *H01L 21/26513* (2013.01); *H01L 21/768* (2013.01); *H01L 21/76801* (2013.01); *H01L 21/76897* (2013.01); *H01L 27/0207* (2013.01); *H01L 27/1085* (2013.01); *H01L 27/10873* (2013.01); *H01L 27/10885* (2013.01); *H01L 27/10888* (2013.01);
(Continued)

(58) Field of Classification Search
CPC ............ H01L 27/108; H01L 27/10811; H01L 27/1082; H01L 27/1085; H01L 27/10858; H01L 27/10861; H01L 29/66181; H01L 29/94; G11C 29/24
See application file for complete search history.

(56) References Cited

U.S. PATENT DOCUMENTS 7,781,830 B2 *  8/2010  Wu .................... H01L 29/1037
                                                      257/331
2007/0132015 A1  6/2007  Kujirai
(Continued)

FOREIGN PATENT DOCUMENTS

| JP | 2007-158269 A | 6/2007 |
|---|---|---|
| KR | 20070012519 A | 1/2007 |
| KR | 20100036596 A | 4/2010 |

OTHER PUBLICATIONS

Office Action from Chinese Patent Office for CN Application No. 201210560741.6, dated Apr. 12, 2017.

*Primary Examiner* — Mark Tornow
*Assistant Examiner* — Mark Hatzilambrou

(57) ABSTRACT

A MOS capacitor, a method of fabricating the same, and a semiconductor device using the same are provided. The MOS capacitor is arranged in an outermost cell block of the semiconductor device employing an open bit line structure. The MOS capacitor includes a first electrode arranged in a semiconductor substrate, a dielectric layer arranged on a semiconductor substrate, and a second electrode arranged on the dielectric layer and including a dummy bit line.

6 Claims, 15 Drawing Sheets

(51) Int. Cl.
    *H01L 27/02*      (2006.01)
    *G11C 7/18*       (2006.01)
    *H01L 21/768*     (2006.01)
    *H01L 21/02*      (2006.01)
    *H01L 21/265*     (2006.01)
    *H01L 27/108*     (2006.01)

(52) U.S. Cl.
    CPC .. *H01L 27/10894* (2013.01); *H01L 27/10897* (2013.01); *H01L 29/66568* (2013.01); *H01L 29/94* (2013.01); *H01L 27/10855* (2013.01)

(56) References Cited

U.S. PATENT DOCUMENTS

| | | |
|---|---|---|
| 2007/0210364 A1 | 9/2007 | Kato et al. |
| 2010/0013004 A1 | 1/2010 | Wu et al. |
| 2010/0080044 A1* | 4/2010 | Seo .......................... G11C 7/12 365/149 |
| 2011/0057260 A1* | 3/2011 | Kadoya ............... H01L 27/0207 257/334 |
| 2011/0272760 A1 | 11/2011 | Kujirai |

* cited by examiner

DUMMY BIT LINE MOS CAPACITOR AND DEVICE USING THE SAME

CROSS-REFERENCES TO RELATED APPLICATION

This application is a divisional of U.S. application Ser. No. 13/692,910 filed on Dec. 3, 2012, which claims priority under 35 U.S.C. 119(a) to Korean application number 10-2012-0077878, filed on Jul. 17, 2012, in the Korean Patent Office, which are incorporated by reference in their entirety.

BACKGROUND OF THE INVENTION

1. Technical Field

The present invention relates to a MOS capacitor, a method of fabricating the same, and a semiconductor device using the same, and more particularly, to a technology of using a dummy cell as a MOS capacitor in a semiconductor device employing an open bit line structure.

2. Related Art

Cost savings is an important factor in dynamic random access memories (DRAMs), and shrinkage in chip size is effective in saving costs.

Until now, memory cell sizes have been shrunk through miniaturization process technology, but there is a further need to shrink the chip size by changing a memory arrangement.

In particular, a scheme of arranging a memory cell, which includes one transistor and one capacitor, and a sense amplifier configured to sense and amplify data of the memory cell, is an essential design factor which affects the chip size of the DRAMs. Schemes of arranging a memory cell array including a plurality of memory cell blocks (or a plurality of memory cell mats) and sense amplifiers, include a folded bit line scheme and an open bit line scheme.

Since, in the folded bit line scheme, one sense amplifier is arranged in pitches of four bit lines, a layout design of the sense amplifier is easier than that of the open bit line scheme. However, since the folded bit line scheme requires a memory cell area that is two times greater than that of the open bit line scheme, the chip size increases.

According to the open bit line scheme, memory cells are arranged in all intersections of word lines and bit lines so that a density of the memory cells is highest and thus a small-sized chip can be obtained. However, a bit line and a complementary bit line, which are connected to different memory cell blocks, are connected to a sense amplifier block in the open bit line scheme. That is, one sense amplifier block is arranged in pitches of two bit lines in a sense amplifier arrangement design.

In an open bit line type memory cell array, as a sense amplifier is connected to bit lines coupled to different memory cell blocks, half of the bit lines in the outermost memory cell block remain in a dummy state. That is, dummy cells, which are coupled to the bit lines in the dummy state and thus cannot act as memory cells, are arranged in the outermost memory cell block. As a result, an unnecessary overhead occurs in connection with the chip size.

BRIEF SUMMARY OF THE INVENTION

Embodiments of the present invention are directed to a semiconductor device capable of increasing a net die of a chip using a dummy cell as a MOS capacitor in an open bit line structure and a method of fabricating the same.

According to one aspect of an exemplary embodiment, there is provided a MOS device that is a semiconductor device arranged in an outermost cell block in an open bit line type cell array. The semiconductor device may include: a first electrode including a channel region and a storage node contact of a dummy cell that is disposed in an outermost cell block of a cell array employing an open bit line structure; a dielectric layer disposed over a portion of the channel region; and a second electrode disposed over the dielectric layer and including a bit line of the dummy cell.

The bit line includes a stacked structure of a polysilicon layer and a metal layer including tungsten (W).

The channel region includes an N-type ion implantation region.

The N-type ion implantation region is formed below a recess formed in an active region of the semiconductor substrate in a predetermined depth.

The semiconductor device may include: dummy cell includes: an active region including a bit line contact (BLC) region, a storage node contact (SNC) region, and the channel region; a first gate and a second gate disposed over the channel region; and the storage node contact disposed in the storage node contact region.

The first electrode further includes a metal contact and a metal line arranged over the storage node contact.

The dielectric layer includes any one selected from the group consisting of silicon oxide ($SiO_2$), silicon oxynitride (SiON), a high-k material such as hafnium oxide ($HfO_2$) or tantalum oxide ($Ta_2O_5$), and a combination thereof.

According to another aspect of an exemplary embodiment, there is provided a semiconductor device arranged in an outermost cell mat in an open bit line structure. The semiconductor device may include: an active region including a bit line contact (BLC) region, a storage node contact (SNC) region, and a channel region; an active region including a bit line contact (BLC) region, a storage node contact (SNC) region, and a channel region; a first electrode; a dielectric layer adjacent to the first electrode and disposed below the bit line contact region; and a second electrode disposed over the dielectric layer and including a dummy bit line, wherein the first electrode includes: an N-type ion implantation region in the channel region; a storage node contact disposed in the storage node contact region; and a metal contact and a metal line arranged over the storage node contact, and wherein the first electrode, the dielectric layer, and the second electrode constitute a capacitor.

The N-type ion implantation region is disposed below a recess formed in the active region in a predetermined depth.

The second electrode includes a stacked structure of a polysilicon layer and a metal layer including tungsten (W).

The dielectric layer includes any one selected from the group consisting of silicon oxide ($SiO_2$), silicon oxynitride (SiON), a high-k material such as hafnium oxide ($HfO_2$) or tantalum oxide ($Ta_2O_5$), and a combination thereof.

According to another aspect of an exemplary embodiment, there is provided a method of fabricating a MOS capacitor which is a semiconductor device arranged in an outermost cell mat in an open bit line structure. The method may include: forming a first electrode in a semiconductor substrate; forming a first electrode, the first electrode including a channel region and a storage node contact; forming a dielectric layer formed over a portion of the channel region; and forming a second electrode over the dielectric layer, the second electrode including a dummy bit line, wherein the first electrode, the dielectric layer, and the second electrode constitute the MOS capacitor.

The forming the dummy bit line includes: forming a polysilicon layer over the semiconductor substrate; and forming a metal layer over the polysilicon layer, wherein the metal layer includes tungsten.

The forming the first electrode includes performing an N-type ion implantation process.

The performing the N-type ion implantation process includes ion-implanting N-type ions into a recess in an active region of the semiconductor substrate in a predetermined depth.

The method may further include: forming the first electrode includes: forming an active region including a bit line contact region, a storage node contact region, and the channel region; forming a first gate and a second gate in the channel region; and forming the storage node contact in the storage node contact region.

The method may further include forming the first electrode further comprises forming a metal contact and a metal line over the storage node contact.

The dielectric layer includes any one selected from the group consisting of silicon oxide ($SiO_2$), silicon oxynitride (SiON), a high-k material such as hafnium oxide ($HfO_2$) or tantalum oxide ($Ta_2O_5$), and a combination thereof.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
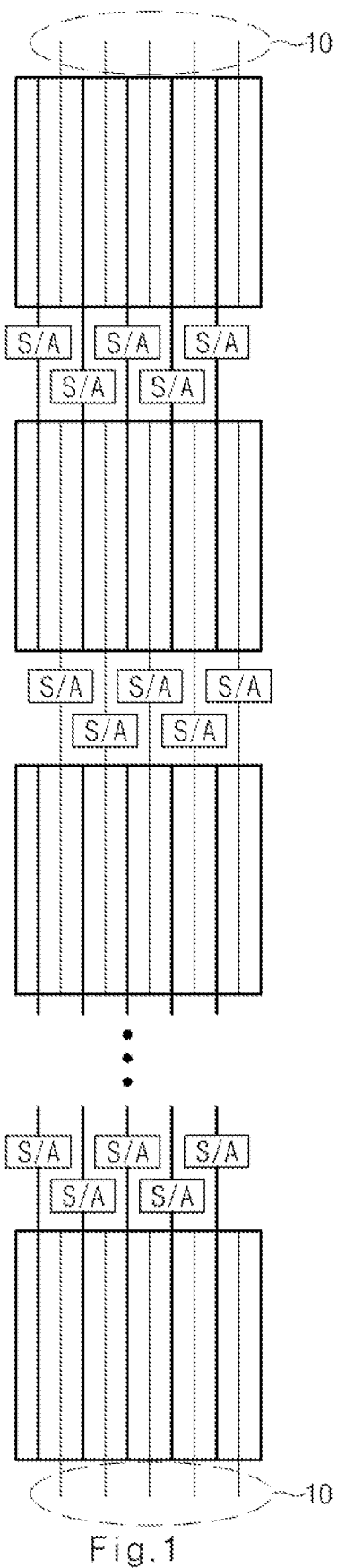
FIG. 1 is a view illustrating dummy cells in an open bit line structure of a semiconductor device.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the illustrations, as a result, for example, of manufacturing techniques and/or tolerances, are to be expected. Thus, exemplary embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may also be present.

Hereinafter, exemplary embodiments of the present invention will be described with reference to FIGS. 1 to 5I.

FIG. 1 is a view illustrating dummy cells in an open bit line structure of a semiconductor device. As shown in FIG. 1, half of the bit lines 10 in the outmost memory cell block are not coupled to any sense amplifier, so they remain in a dummy state. According to an embodiment of the present invention, the dummy bit lines 10 can be used as MOS capacitors.

Figure 2:
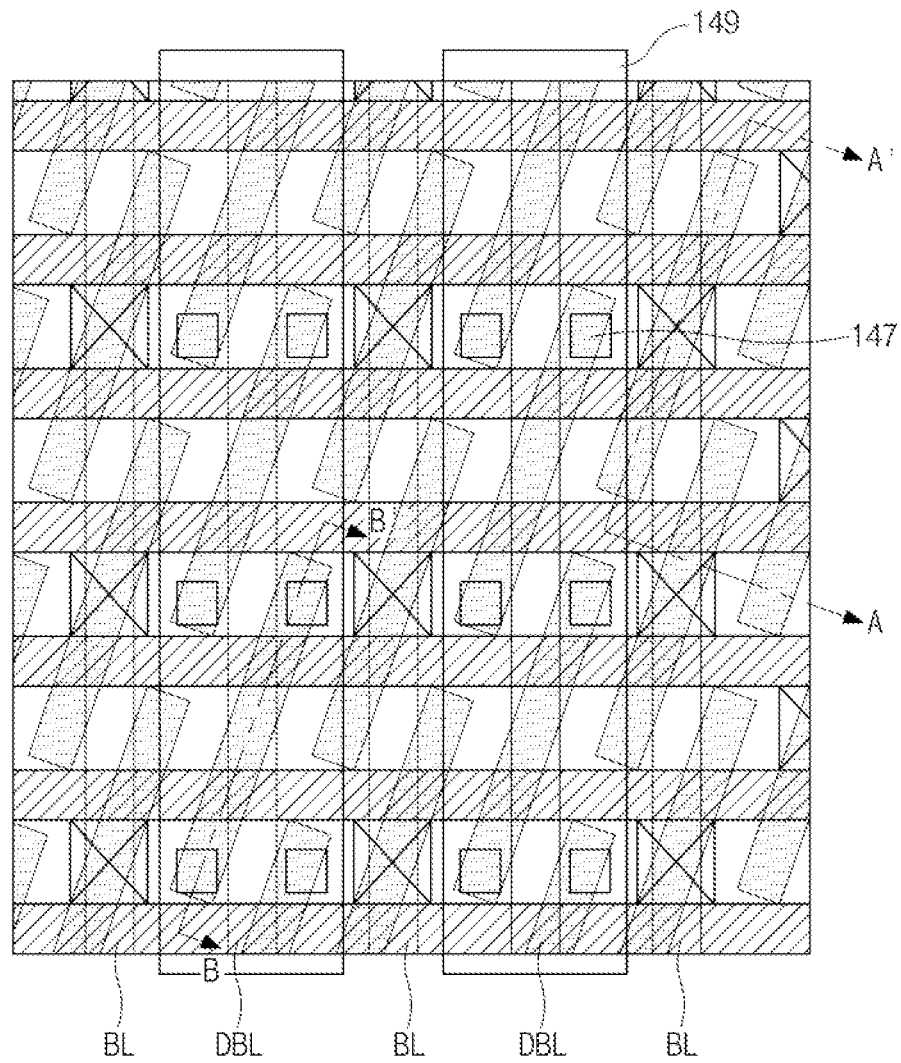
FIG. 2 is a plan view illustrating a semiconductor device.

FIG. 2 is a plan view illustrating a semiconductor device. As shown in FIG. 2, metal contacts 147 are formed on storage node contacts at both sides of each of dummy bit line DBL, and the dummy bit lines DBL are connected to metal lines 149 through the metal contacts 147. Thus, the dummy cells are used as MOS capacitors for other areas including a peripheral circuit area so that the total chip area is reduced to increase a net die.

Figure 3:
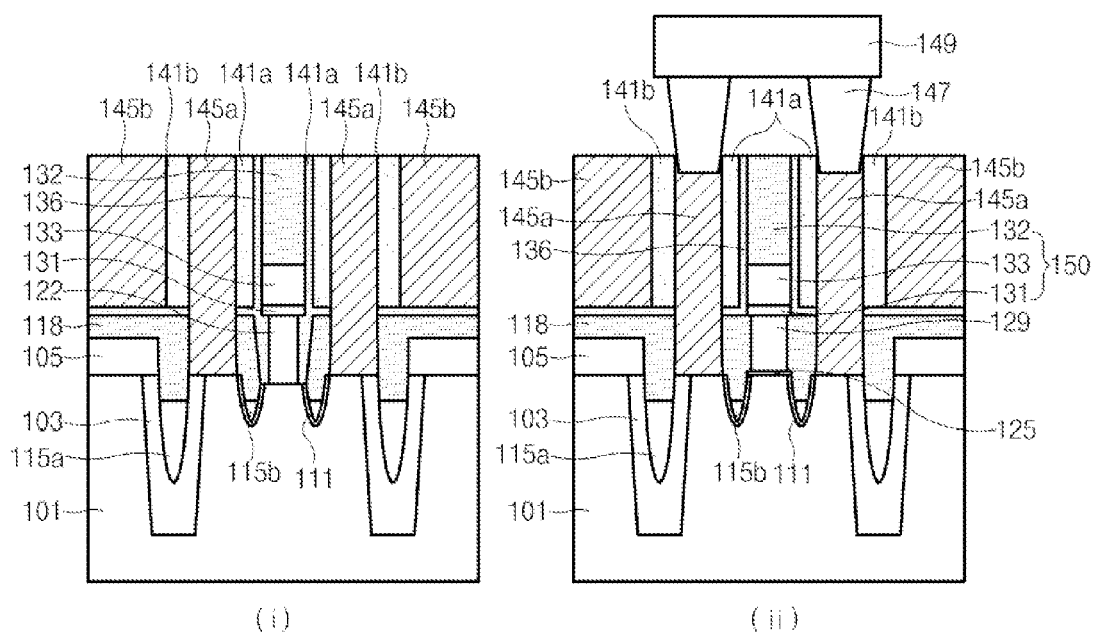
FIG. 3 is a cross-sectional view illustrating a semiconductor device according to an embodiment of the present invention.

FIG. 3 is a cross-sectional view illustrating a semiconductor device according to an embodiment of the present invention.

In FIG. 3, (i) shows a cross-sectional view of a memory cell area, and (ii) shows a cross-sectional view of a dummy cell area. The memory cell area (i) shows a cross-sectional view taken along a line A-A' of FIG. 2, and the dummy cell area (ii) shows a cross-sectional view taken along a line B-B' of FIG. 2.

In the dummy cell area (ii), an oxide layer 125 is formed in a region between buried gates 115b over a semiconductor substrate 101. Then, a bit line contact 129 is formed on the oxide layer 125. Then, a barrier metal 131, and a tungsten layer 133, a hard mask 132 are sequentially stacked on the bit line contact 129 to form a dummy bit line 150. The bit line contact 129 may includes polysilicon layer. The oxide layer 125 may include silicon oxide ($SiO_2$), silicon oxynitride (SiON), or a high-k material such as hafnium oxide ($HfO_2$) or tantalum oxide ($Ta_2O_5$).

A spacer 136 is formed on both sides of the dummy bit line 150, and storage node contacts 145a are formed over a channel region, a source region, and a drain region of the semiconductor substrate 101. A storage node contact spacer 141b, which is formed over the buried gates 115a in an isolation layer 103, is formed on the sidewalls of the storage node contacts 145a. In addition, metal contacts 147 are provided on the storage node contacts 145a, and a metal line 149 is formed on the metal contacts 147 to be connected to the metal contacts 147.

The channel region below the buried gate 115b, the source and drain regions, the storage node contact 145a, the metal contact 147, and the metal line 149 constitute a first electrode. The oxide layer 125 serves as a dielectric layer. The dummy bit line 150 serves as a second electrode. As a result, a MOS capacitor is formed including the first electrode, the dielectric layer, and the second electrode.

That is, the storage node contacts 145a are connected to the source and drain regions, and the metal contacts 147 are connected to the storage node contacts 145a, so that the storage node contacts 145a and the metal contacts 147 act as the first electrode of the MOS capacitor.

In an embodiment, the oxide layer 125 acts as the dielectric layer of the MOS capacitor, and the dummy bit line 150 is formed over the oxide layer 125) so that the dummy bit line 150 acts as the second electrode of the MOS capacitor. Therefore, the dummy cell area can be utilized as a MOS capacitor area, and thus chip area can be reduced.

Hereinafter, a method of fabricating a semiconductor device in accordance with a first embodiment of the present invention will be described with reference to FIGS. 4A to 4M. In FIGS. 4A to 4M, (i) is a cross-sectional view of a memory cell area, and (ii) is a cross-sectional view of a dummy cell area.

Figure 4A:
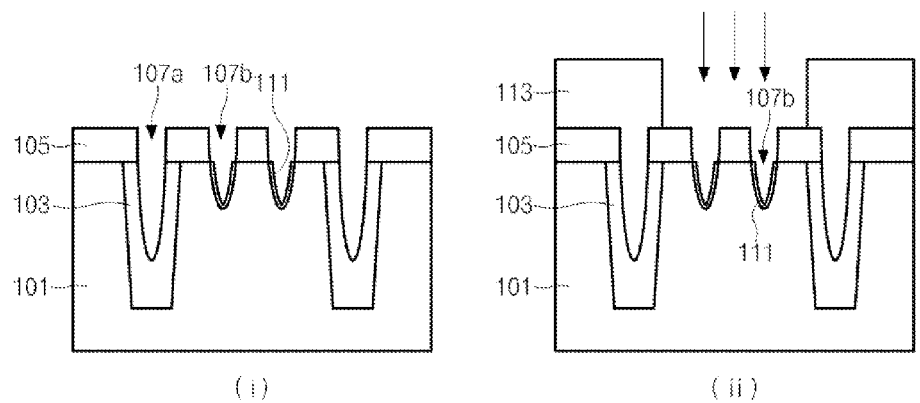
FIGS. 4A to 4M illustrate a method of fabricating a semiconductor device according to a first embodiment of the present invention.

Referring to FIG. 4A, a hard mask 105 for patterning buried gates is formed on a semiconductor substrate 101 including an isolation layer 103. A recess 107a is formed in the isolation layer 103, and a recess 107b for the buried gate formation is formed in an active region of the semiconductor substrate 101, using the hard mask 105. Then, a buried gate oxide layer 111 is formed along the surface of the recess 107b. At this time, the buried gate oxide layer 111 may be formed through an annealing process.

Next, a photoresist 113 for performing N-type ion implantation into the recess 107b of the dummy cell area (ii) is formed over a side of the isolation layer 103 to open the recess 107b, and then N-type impurities are ion-implanted into the recess 107b of the dummy cell area (ii). As a result, N-type ions are implanted into the recess 107b, forming an N-type ion implantation region serving as a channel region below the recess 107b.

Figure 4B:
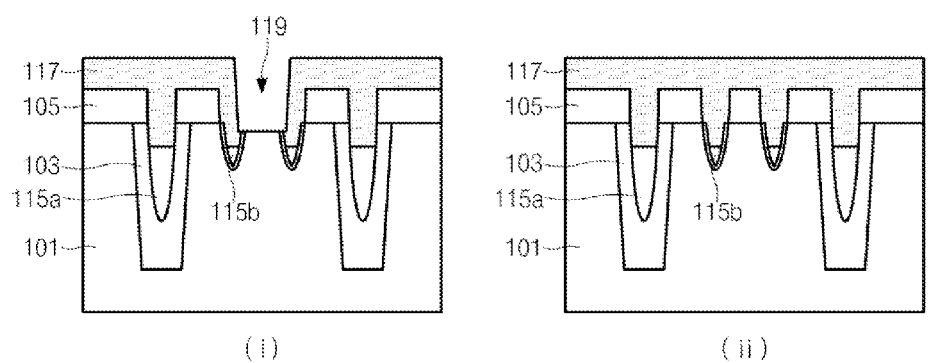

Referring to FIG. 4B, the photoresist 113 is removed. A tungsten (W) layer is deposited on a structure where the photoresist 113 is removed to be buried within the recess 107b and then etched back to form buried gates 115a and 115b. A nitride layer 117 for buried gate sealing is formed on the buried gates 115a and 115b and the hard mask 105. In accordance with another embodiment, the buried gates 115a and 115b may be formed of metal such as titanium (Ti), titanium nitride (TiN), a polysilicon layer, or a combination thereof. Subsequently, a bit line contact mask (not shown) is formed on the memory cell area (i) while the dummy cell area (ii) is covered with the nitride layer 117. A bit line contact etching process is performed using the bit line contact mask to form a bit line contact hole 119 in the memory cell area (i). The bit line contact hole 119 is formed on a portion of the semiconductor substrate 101 and over the buried gates 115b formed in the semiconductor substrate 101.

Figure 4C:
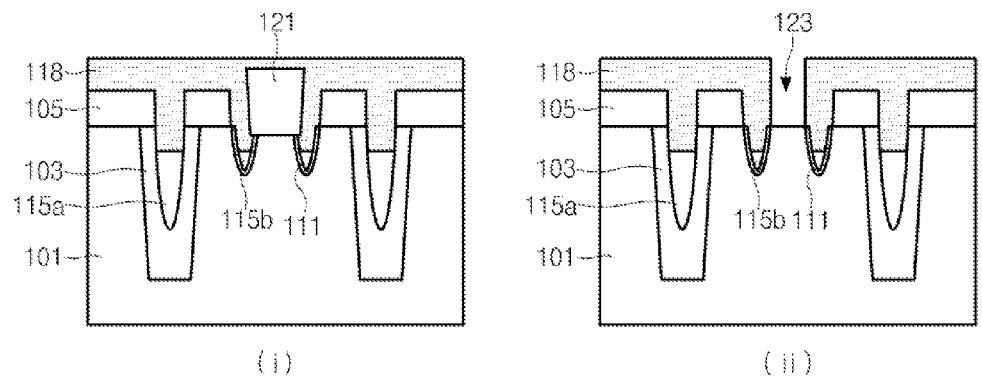

Referring to FIG. 4C, a polysilicon material is deposited to be buried within the bit line contact hole 119 of the memory cell area (i), and a capping nitride layer 118 is deposited on the polysilicon layer and the nitride layer 117 to form a bit line contact 121. In accordance with another embodiment, the capping nitride layer may include a silicon oxide layer. In a process of FIG. 4C and subsequent processes, the capping nitride layer and the nitride layer 117 are referred to as a bit line capping nitride layer 118.

The hard mask 105 and the bit line capping nitride layer 118 over the buried gates 115b of the dummy cell area (ii) are etched using an open mask for a peripheral circuit (not shown) while the memory cell area (i) is covered with the bit line capping nitride layer 118, and thus a bit line contact hole 123 is formed to expose the semiconductor substrate between the buried gates 115b of the dummy cell area (ii).

Figure 4D:
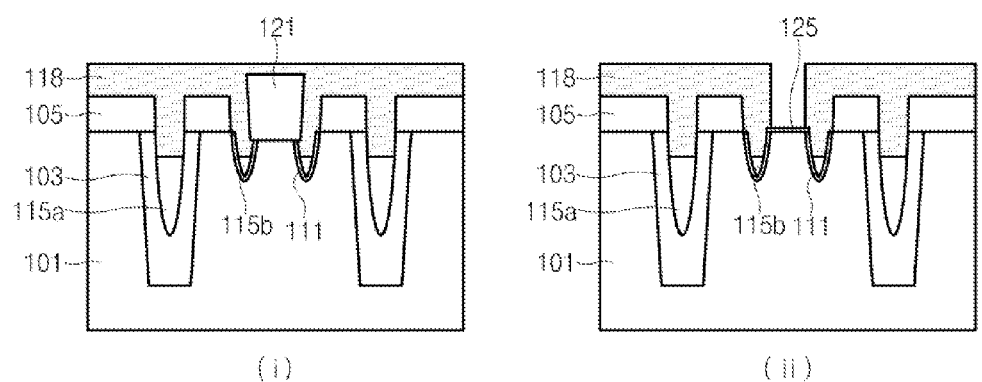

Referring to FIG. 4D, an oxide layer 125 is formed on a bottom of the bit line contact hole 123 of the dummy cell area (ii) while the memory cell area (i) is covered with the bit line capping nitride layer 118. At this time, the process of forming the oxide layer 125 is simultaneously performed with a process of forming a gate oxide layer in a peripheral circuit area (not shown). The oxide layer 125 may be formed through an annealing process.

Figure 4E:
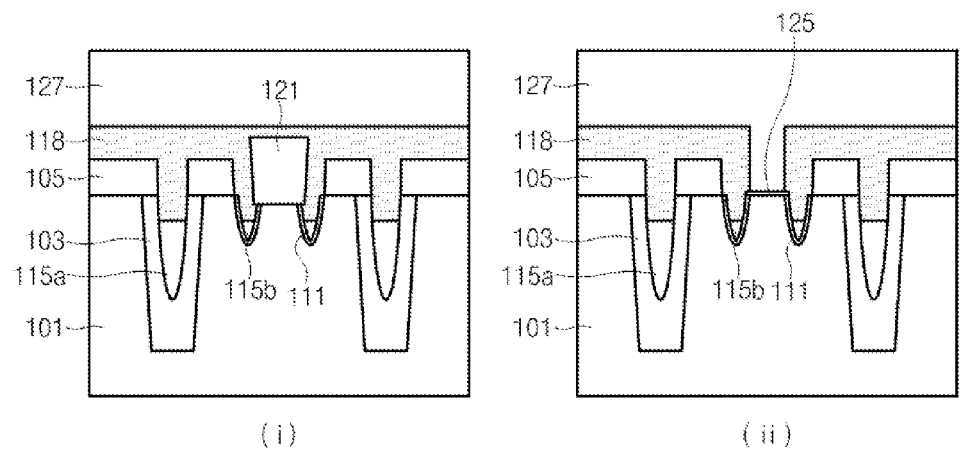

Referring to FIG. 4E, a polysilicon layer 127 is deposited on the memory cell area (i) and the dummy cell area (ii). The polysilicon layer 127 is formed to fill the bit line contact hole 123 of the dummy cell area (ii).

Figure 4F:
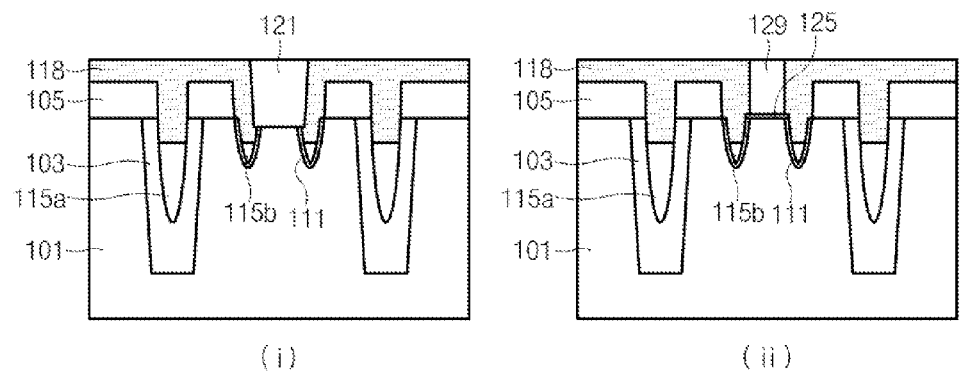

Referring to FIG. 4F, the bit line contact 121 is exposed and a dummy bit line contact 129 is formed by planarizing the polysilicon layer 127 and a portion of the bit line capping nitride layer 118 or etching the polysilicon layer 127 and the portion of the bit line capping nitride layer 118 in the memory cell area (i) and the dummy cell area (ii) using a cell open mask.

Figure 4G:
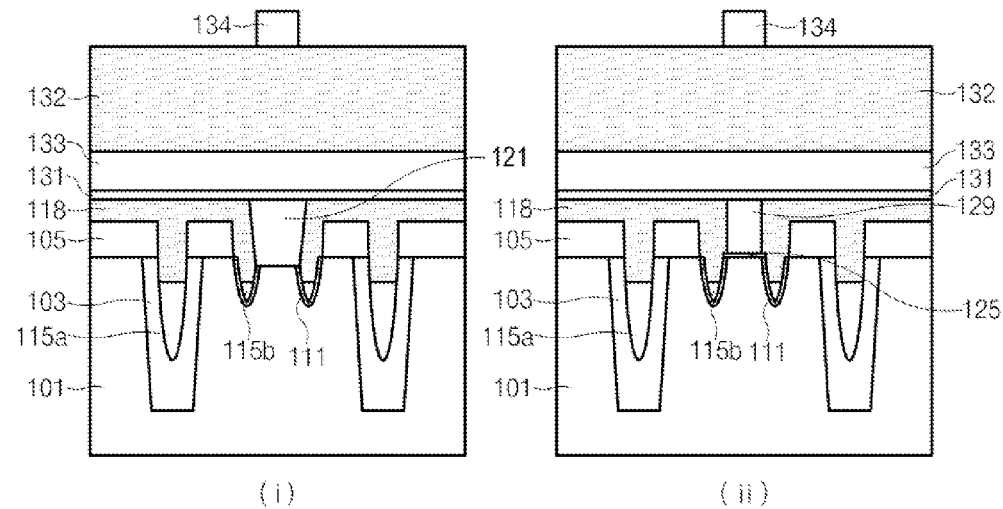

Referring to FIG. 4G, a barrier metal 131, a tungsten layer 133 and a hard mask 132 are sequentially deposited on the bit line contact 121 and the dummy bit line contact 129, and a global bit line mask 134 is deposited on the hard mask 132 for forming a bit line pattern and a bit line contact pattern.

Figure 4H:
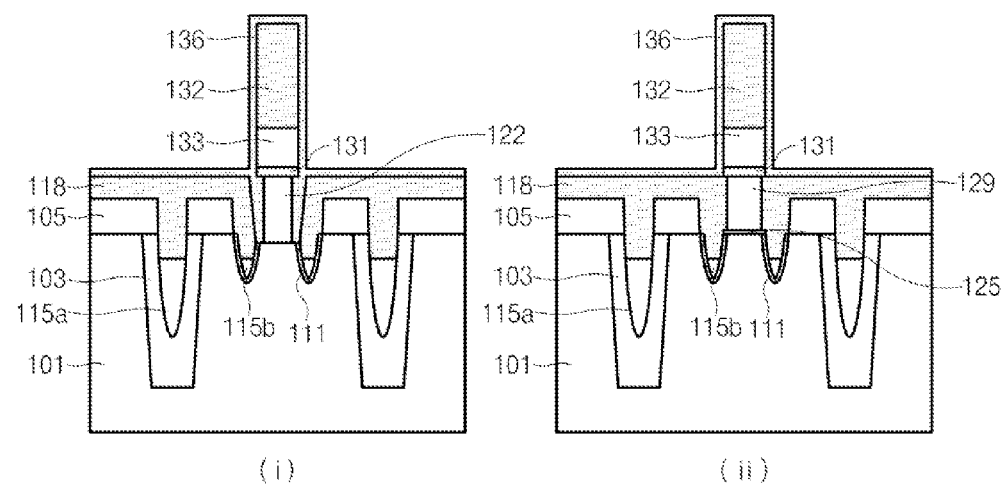

Referring to FIG. 4H, the barrier metal 131, the tungsten layer 133, the hard mask 132, and the bit line contact 121 are etched using the global bit line mask 134, and thus the bit line pattern and the bit line contact pattern 122 is formed. Then, a spacer 136 is formed on an upper surface of the bit line pattern and sidewalls of the bit line pattern and the bit line contact pattern 122 with a predetermined thickness. The spacer 136 may include nitride layer. After that, a portion of the spacer formed on the hard mask 132 is removed.

Figure 4I:
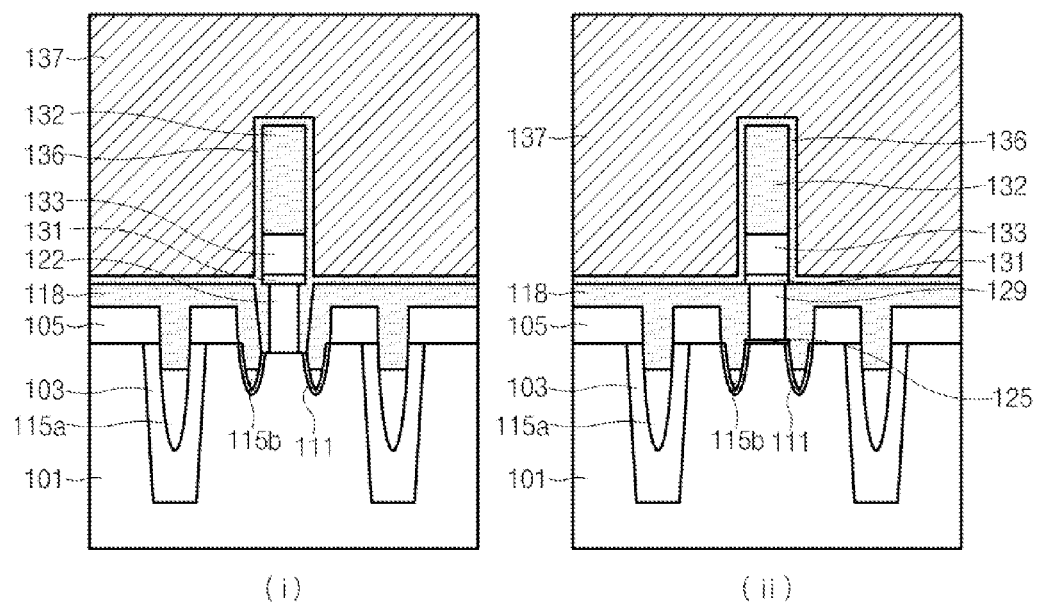

Referring to FIG. 4I, an oxide layer 137 is deposited on a resultant structure including the spacer 136, which is formed through the processes of FIG. 4H.

Figure 4J:
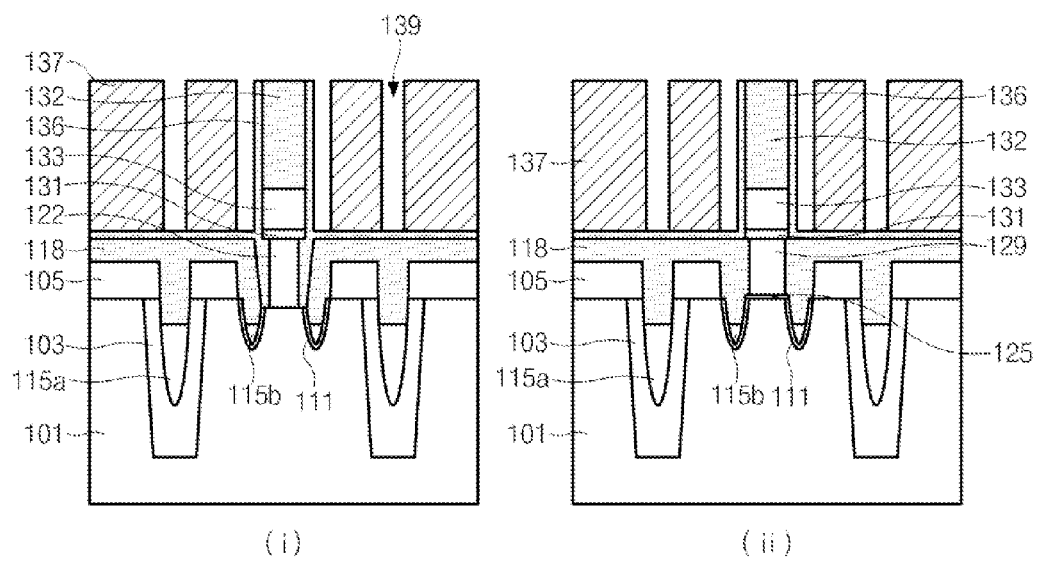

Referring to FIG. 4J, the oxide layer 137 is patterned using a cell open mask to form holes 139 for storage node contact spacer formation.

Figure 4K:
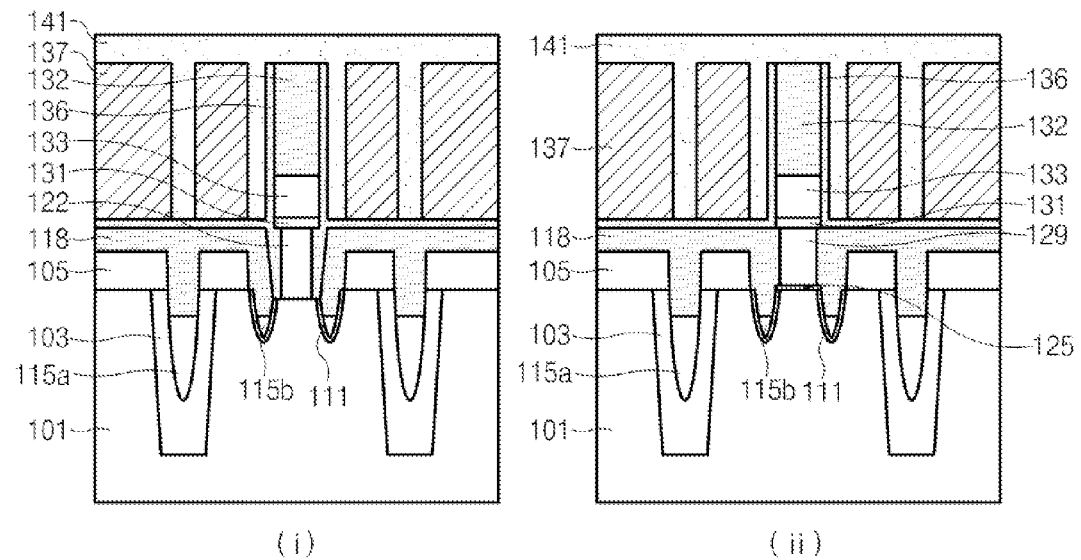

Referring to FIG. 4K, a nitride layer 141 is formed on the oxide layer 137 and fills the holes 139 formed in FIG. 4J, and then a planarization process is performed on the nitride layer 141 to expose the patterned oxide layer 137.

Figure 4L:
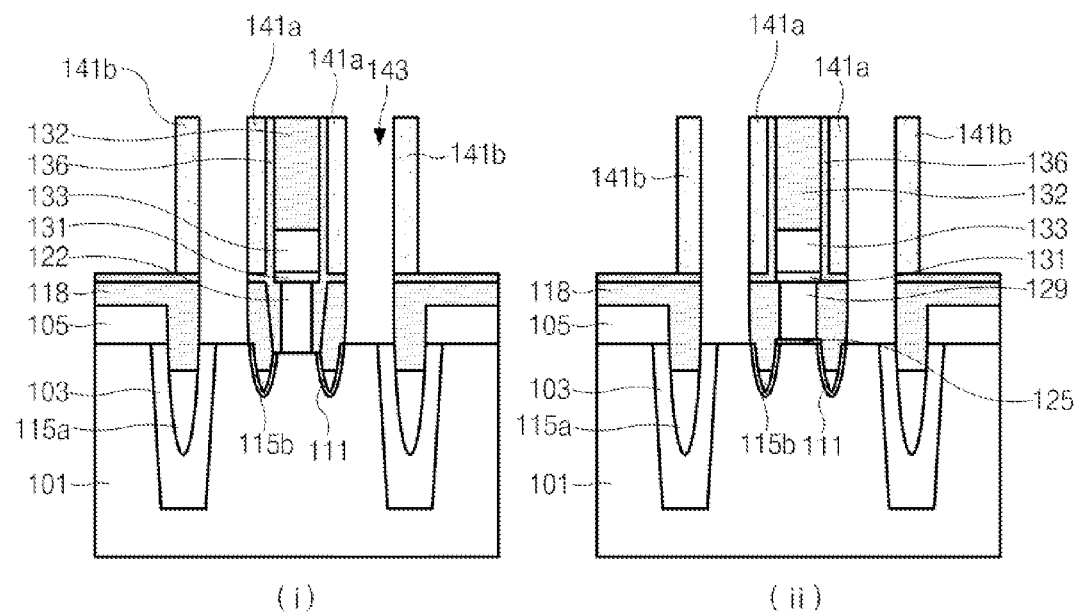

Referring to FIG. 4L, the patterned oxide layers 137 are completely removed using a mask for storage node contact formation. After that, the nitride layer 118 and the hard mask 105 in a region between a first storage node contact spacer 141a and a second storage node contact spacer 141b are removed to expose the semiconductor substrate 101 and the isolation layer 103, thereby forming a hole 143 for the storage node contact formation.

Figure 4M:
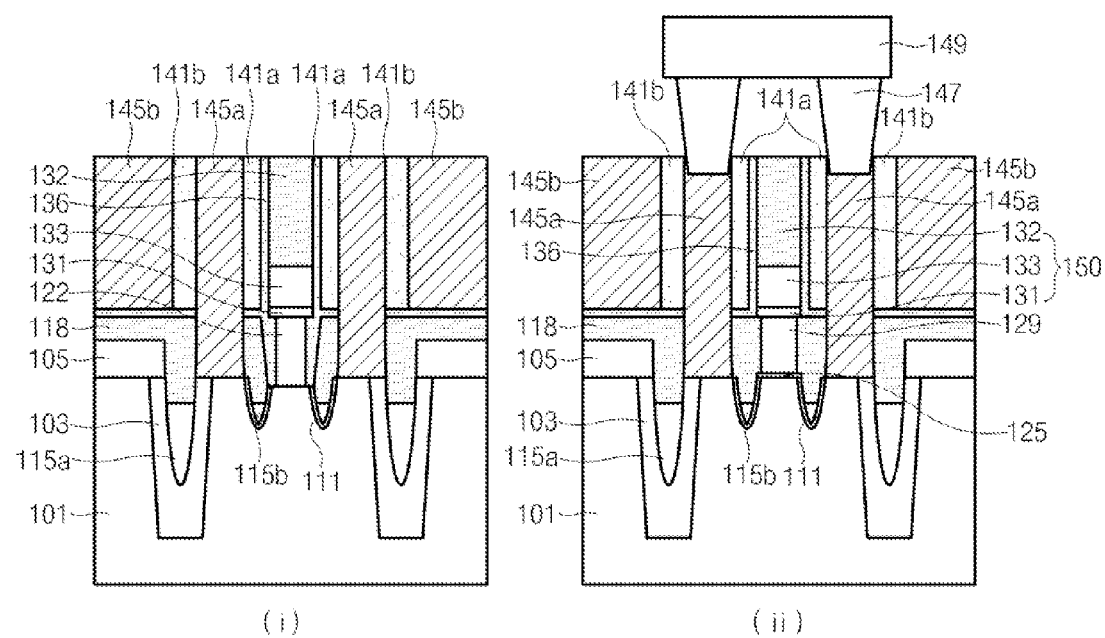

Referring to FIG. 4M, a polysilicon material is deposited to fill the holes 143 of the memory cell area (i) and the dummy cell area (ii) formed in FIG. 4L, and then a flow process and a chemical mechanical polishing (CMP) process are performed on the polysilicon material to form storage node contacts 145a over the active region and in the region between the first and second storage node contact spacers 141a and 141b that are formed on both sides of each of storage node contacts 145a. At this time, the first storage node contact spacers 141a are formed over the buried gates 115b, and the second storage node contact spacers 141b are formed over the buried gates 115a formed in the isolation layer 103. As a result, the storage node contact 145a is disposed between the first and second storage node contact spacers 141a and 141b. When the first and second storage node contact spacers 141a and 141b are formed, a polysilicon material 145b is deposited on the other side of the second storage node contact spacers 141b, which is disposed opposite to the corresponding storage node contact 145a.

Next, metal contacts 147 are formed on the storage node contacts 145a of the dummy cell area (ii), and a metal line 149 is formed on the metal contacts 147.

In the above-described first embodiment, the bit line contact of the dummy cell area (ii) is not formed when the bit line contact of the memory cell area (i) is formed. Instead, an etching process is performed using an open mask for a peripheral circuit area so that a dummy bit line 150 is formed to have the same structure as that of a gate in the peripheral circuit area. Therefore, the dummy bit line 150 and the gate in the peripheral circuit area has a structure in which the barrier metal 131, the tungsten layer 133, and a hard mask 132 are sequentially stacked.

The channel region beneath the buried gates 115b and the oxide layer 125, the storage node contact 145a, the metal contact 147, and the metal line 149 constitute a first electrode. The oxide layer 125 serves as a dielectric layer. The polysilicon layer 129, the barrier metal 131, and the tungsten layer 133 sequentially stacked on the oxide layer 125 constitute a second electrode. The first electrode, the dielectric layer, and the second electrode constitute a capacitor.

Hereinafter, a method of fabricating a semiconductor device according to a second embodiment will be described with reference to FIGS. 5A to 5I.

In FIGS. 5a to 5I, (i) shows a cross-sectional view of a memory cell area, and (ii) shows a cross-sectional view of a dummy cell area.

Figure 5A:
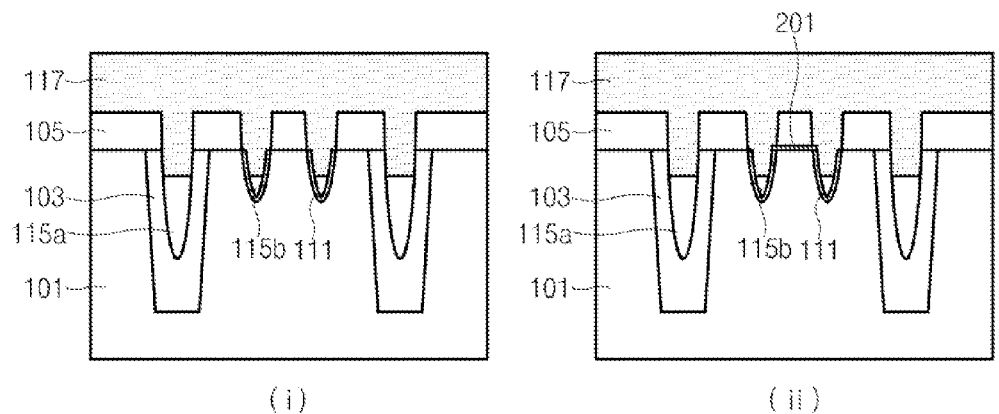
FIGS. 5A and 5I illustrate a method of fabricating a semiconductor device according to a second embodiment of the present invention.

Referring to FIG. 5A, an isolation layer 103 is formed in a semiconductor substrate 101, and a pad oxide layer (not shown) is deposited on the isolation layer 103 and the semiconductor substrate 101. After that, a structure where the pad oxide layer is deposited is patterned. At this time, the pad oxide layer 201 remains in a dummy bit line region to have a predetermined thickness using a mask or etch selectivity.

Next, a hard mask 105 for patterning buried gates is formed on the semiconductor substrate 101 including the isolation layer 103, and then recesses for the buried gate formation are formed in the semiconductor substrate 101 and the isolation layer 103. Subsequently, a buried gate oxide layer 111 is formed in the recesses formed in the semiconductor substrate 101. Buried gates 115a are formed in the recesses formed in the isolation layer 103, and buried gates 115b are formed on the buried gate oxide layer 111 in the recesses formed in the semiconductor substrate 101. After that, a nitride layer 117 is deposited on the buried gates 115a and 115b and the hard mask 105.

Figure 5B:
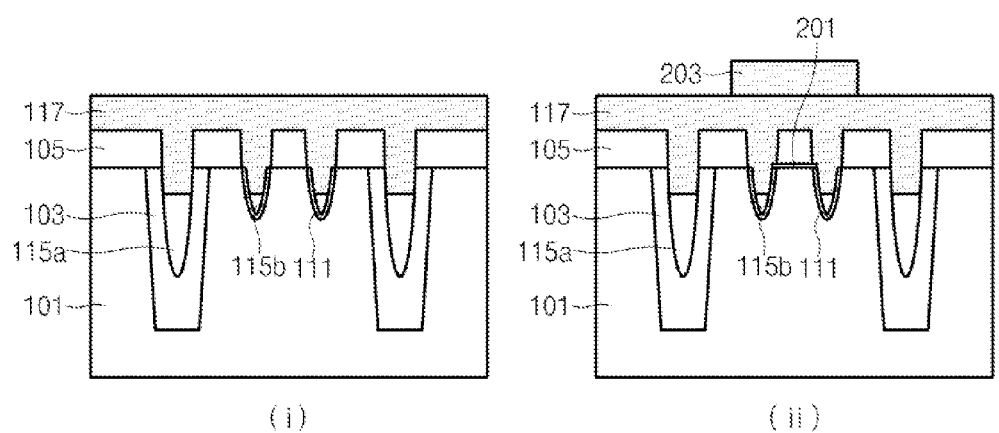

Referring to FIG. 5B, a hard mask nitride material is deposited on the nitride layer 117 and patterned so that a nitride layer 203 remains in a predetermined thickness over the pad oxide layer 201 and the buried gates 115b.

Figure 5C:
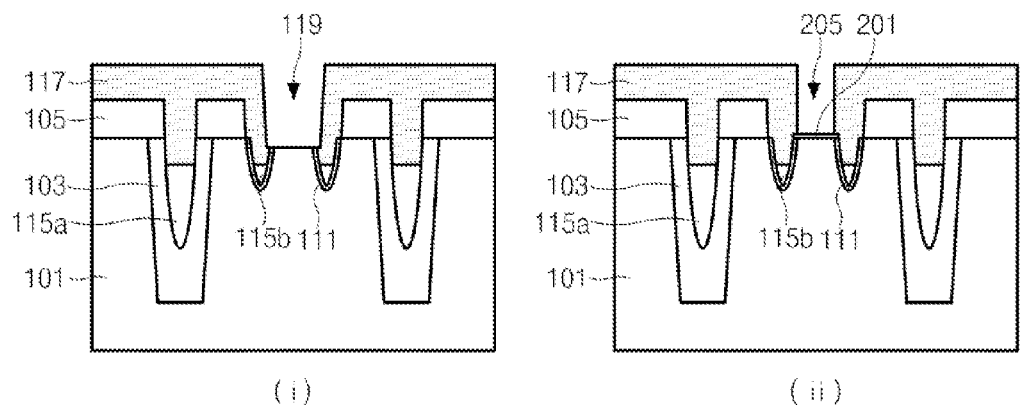

Referring to FIG. 5C, bit line contact holes 119 and 205 are formed in a region between the buried gates 115b of the memory cell area (i) and the dummy cell area (ii), respectively, through an etch process. At this time, the bit line contact hole 119 of the memory cell area (i) is formed by etching the nitride layer 117 and the hard mask 105 in the memory cell area (i) until the semiconductor substrate 101 is exposed. The bit line contact hole 205 of the dummy cell area (ii) is formed by etching the nitride layers 203 and 117 and the hard mask 105 in the dummy cell area (ii) until the pad oxide layer 201 is exposed. When the nitride layers 203 and 117 and the hard mask 105 in the dummy cell area (ii) are etched, the pad oxide layer 201 in the dummy cell area (ii) is not removed by the nitride layer 203.

Figure 5D:
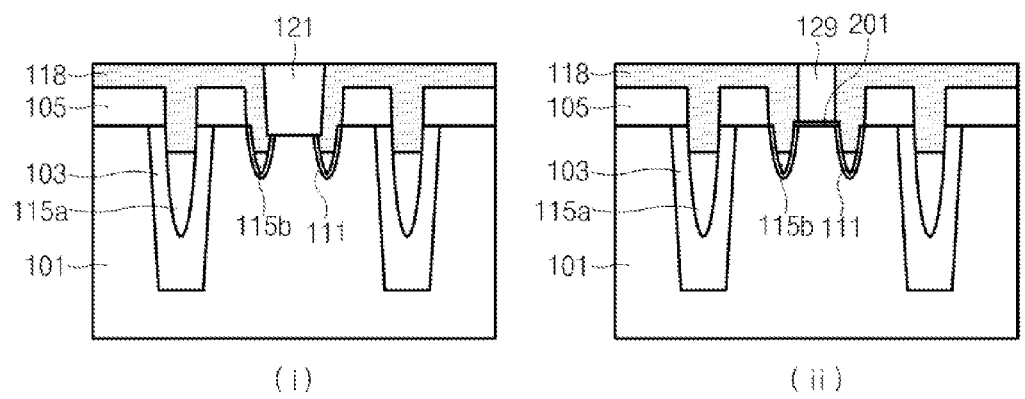
Figure 5E:
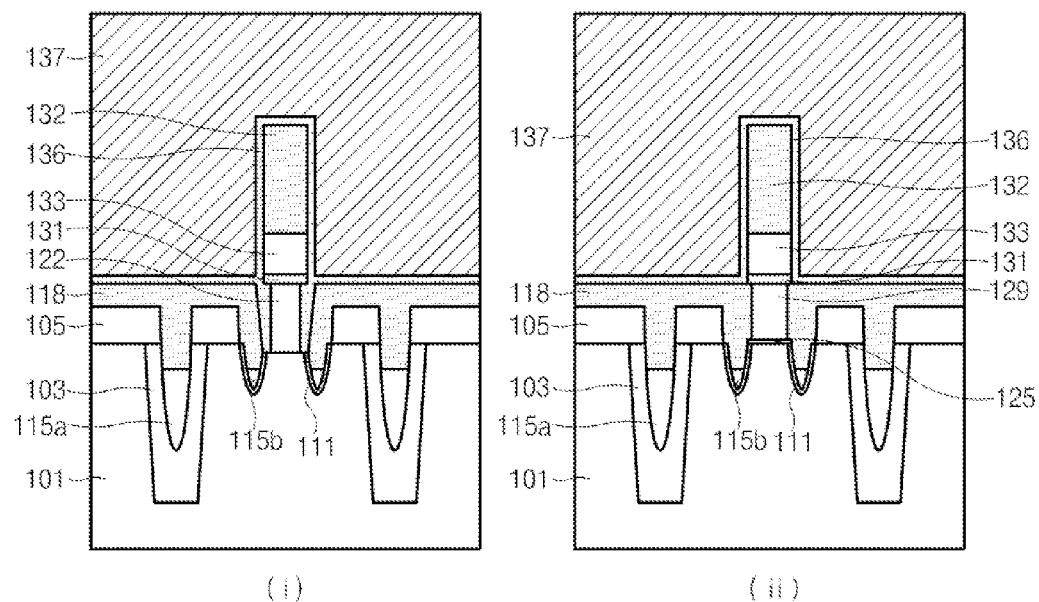
Figure 5F:
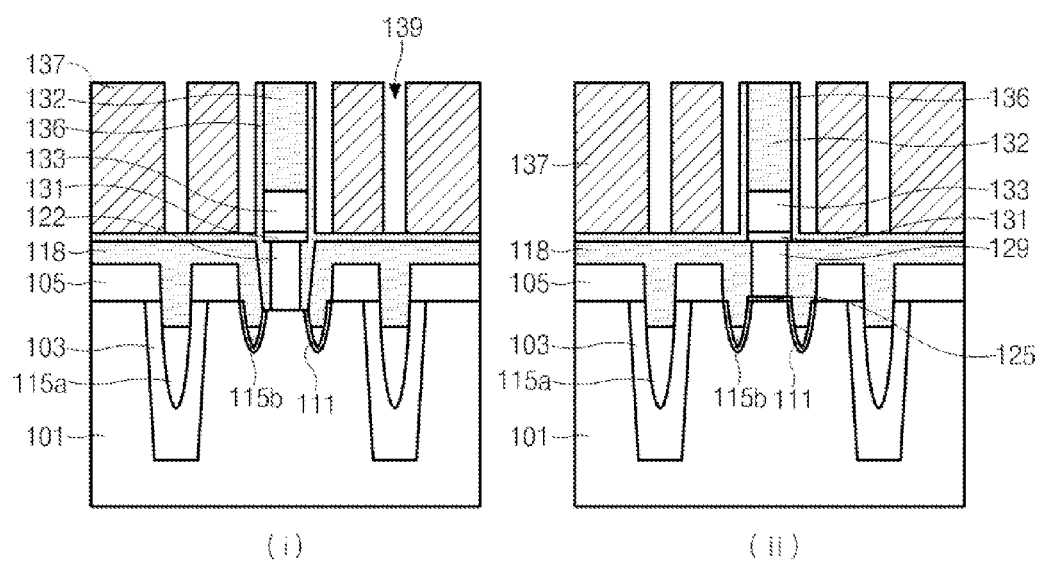
Figure 5G:
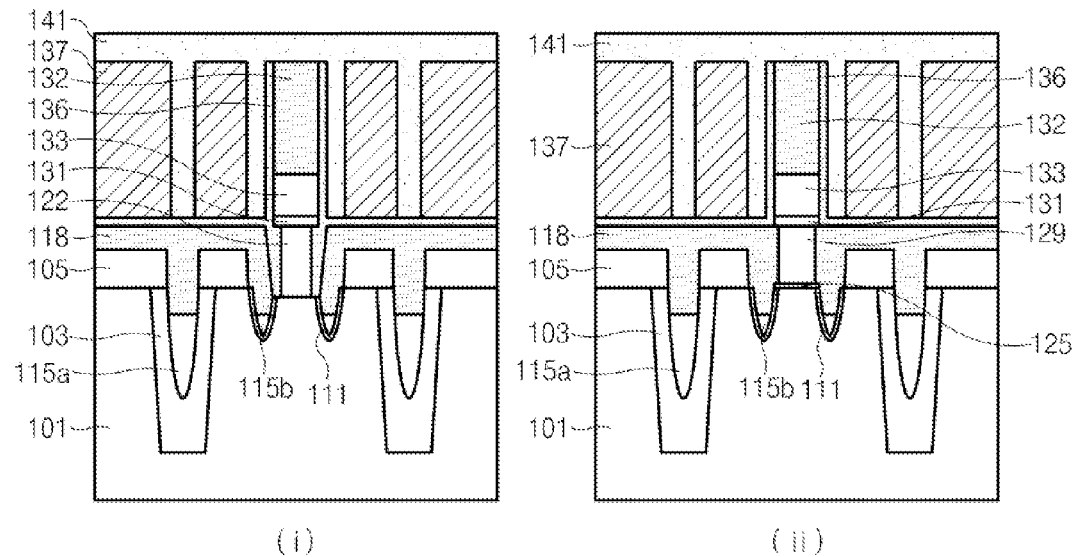
Figure 5H:
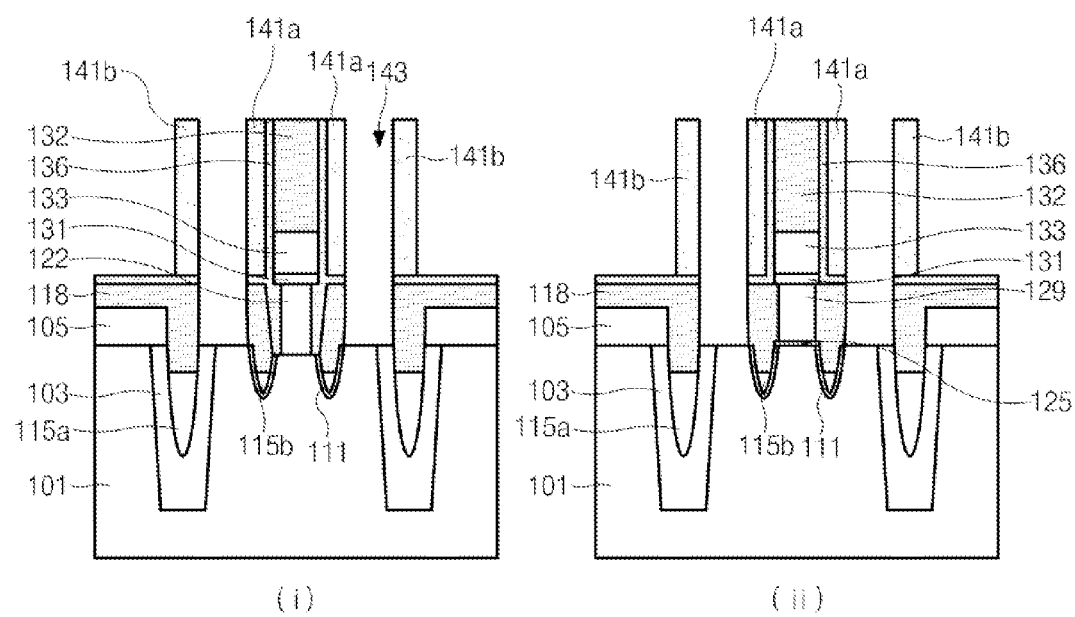
Figure 5I:
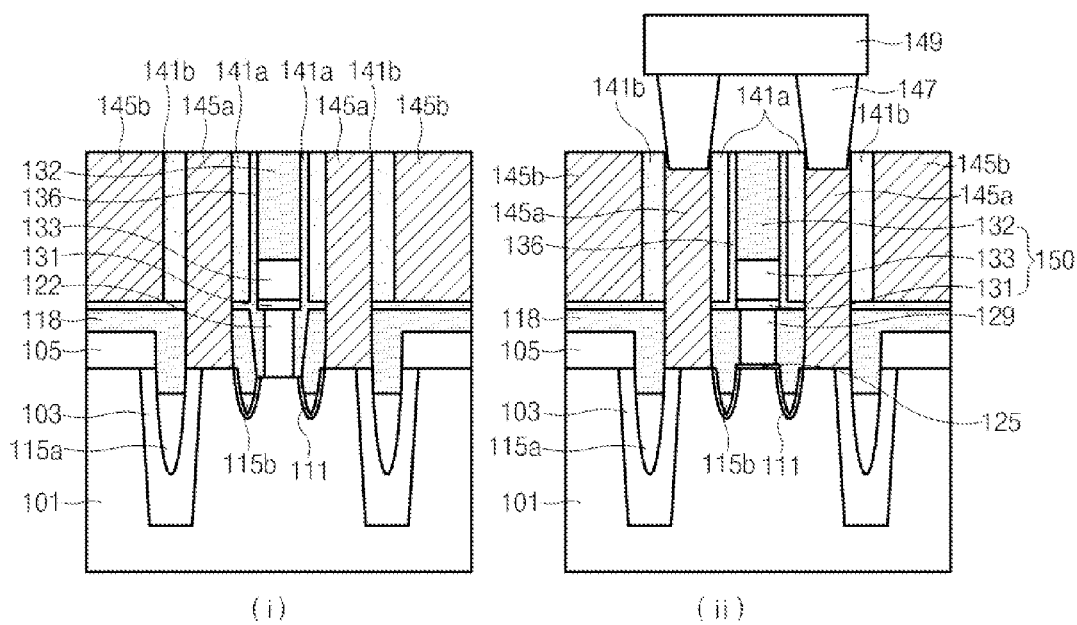

Referring to FIG. 5D, a polysilicon layer is deposited on the memory cell area (i) and the dummy cell area (ii) to fill the bit line contact holes 119 and 205, so that a bit line contact 121 and a dummy bit line contact 129 are formed in the memory cell area (i) and the dummy cell area (ii), respectively.

Processes illustrated in FIGS. 5E to 5I are the same as the processes illustrated in FIGS. 4I to 4M, and thus detailed description thereof is omitted.

In the second embodiment, the pad oxide layer deposited after the device isolation layer 103 is formed partially remains below the bit line contact 150 to be used as a dielectric layer of a capacitor.

The semiconductor device and the method of fabricating the same according to the embodiments have following effects.

First, a chip area can be effectively utilized using the dummy cells, which otherwise unnecessarily occupy a portion of the chip area, as MOS capacitors.

Second, a noise characteristic of a semiconductor device can be improved by increasing capacitance using dummy cells as MOS capacitors.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A method of fabricating a MOS capacitor arranged in an outermost cell block of a cell array including a memory cell and a dummy cell, the method comprising:
    forming a first recess in a first active region in a memory cell region and a second recess in a second active region in a dummy cell region;
    forming a first dielectric layer over an inner sidewall of the first recess and a second dielectric layer over an inner sidewall of the second recess;
    implanting ions into the second recess;
    forming a first gate over the first dielectric layer in the first recess and a second gate over the second dielectric layer in the second recess;
    forming a third dielectric layer over the second active region of a first side of the second gate;
    forming a bit line over the first active region of a first side of the first gate and a dummy bit line over the third dielectric layer, the bit line being electrically coupled to the first active region and the dummy bit line being electrically isolated from the second active region; and
    forming a first storage node contact over the first active region of a second side of the first gate and a second storage node contact over the second active region of a second side of the second gate.

2. The method of claim 1, wherein forming the bit line and dummy bit line includes:
    forming a polysilicon layer; and
    forming a metal layer over the polysilicon layer,
    wherein the metal layer includes tungsten.

3. The method of claim 1, wherein implanting ions into the second recess includes performing an N-type ion implantation process.

4. The method of claim 3, wherein performing the N-type ion implantation process includes ion-implanting N-type ions into the second recess to form a channel region in the second active region in a predetermined depth.

5. The method of claim 1, further comprising forming a metal contact and a metal line over the second storage node contact.

6. The method of claim 1, wherein the third dielectric layer includes any one selected from the group consisting of silicon oxide ($SiO_2$), silicon oxynitride (SiON), a high-k material, and a combination thereof.

* * * * *